(12) United States Patent
Lee et al.

(10) Patent No.: US 7,423,275 B2
(45) Date of Patent: Sep. 9, 2008

(54) EROSION MITIGATION FOR COLLECTOR OPTICS USING ELECTRIC AND MAGNETIC FIELDS

(75) Inventors: Sang Hun Lee, Sunnyvale, CA (US); Robert Bristol, Portland, OR (US); Arun Ramamoorthy, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 10/759,344

(22) Filed: Jan. 15, 2004

(65) Prior Publication Data

US 2005/0155624 A1 Jul. 21, 2005

(51) Int. Cl.
*H01J 1/50* (2006.01)

(52) U.S. Cl. ............................. 250/492.2; 250/504 R; 250/396 ML

(58) Field of Classification Search .................. 134/1.1; 250/396 R–396 ML
See application file for complete search history.

(56) References Cited

U.S. PATENT DOCUMENTS 6,972,421 B2 * 12/2005 Melnychuk et al. ..... 250/504 R
2005/0140945 A1 * 6/2005 Banine et al. ................. 355/30

OTHER PUBLICATIONS

Tsai et al., "Different electrostatic methods for making electret filters," Jnl. of Electrostatics 54 (2002), pp. 333-341.
Kravtsov et al., "Analysis of the polarization state of melt-spun polypropylene fibers," Jnl. of Materials Proc. Technol., 124 (2002), pp. 160-165.

* cited by examiner

*Primary Examiner*—Jack I. Berman
*Assistant Examiner*—Andrew Smyth
(74) *Attorney, Agent, or Firm*—Fish & Richardson P.C.

(57) ABSTRACT

A magnetic and/or electric field may be generated around collector optics in an EUV lithography system to deflect debris particles from the reflective surfaces of the optics. The magnetic and/or electric field may be generated by a solenoid structure around the optics or by passing current through inner an outer shells in a nested shell arrangement.

29 Claims, 7 Drawing Sheets

COLLECTOR OPTICS WITH A SOLENOID TO GENERATE MAGNETIC FIELD

EROSION MITIGATION FOR COLLECTOR OPTICS USING ELECTRIC AND MAGNETIC FIELDS

BACKGROUND

Lithography is used in the fabrication of semiconductor devices. In lithography, a light sensitive material, called a "photoresist", coats a wafer substrate, such as silicon. The photoresist may be exposed to light reflected from a mask to reproduce an image of the mask. When the wafer and mask are illuminated, the photoresist undergoes chemical reactions and is then developed to produce a replicated pattern of the mask on the wafer.

Extreme Ultraviolet (EUV) lithography is a promising future lithography technique. EUV light may be produced using a small, hot plasma that will efficiently radiate at a desired wavelength, e.g., in a range of approximately 11 nm to 15 nm. The plasma may be created in a vacuum chamber, typically by driving a pulsed electrical discharge through the target material or by focusing a pulsed laser beam onto the target material. The light produced by the plasma is then collected by nearby mirrors and sent downstream to the rest of the lithography tool.

The hot plasma tends to erode materials nearby, e.g., the electrodes in electric discharge sources. The eroded material may coat the collector optics, resulting in a loss of reflectivity and reducing the amount of light available for lithography.

DETAILED DESCRIPTION

Figure 1:
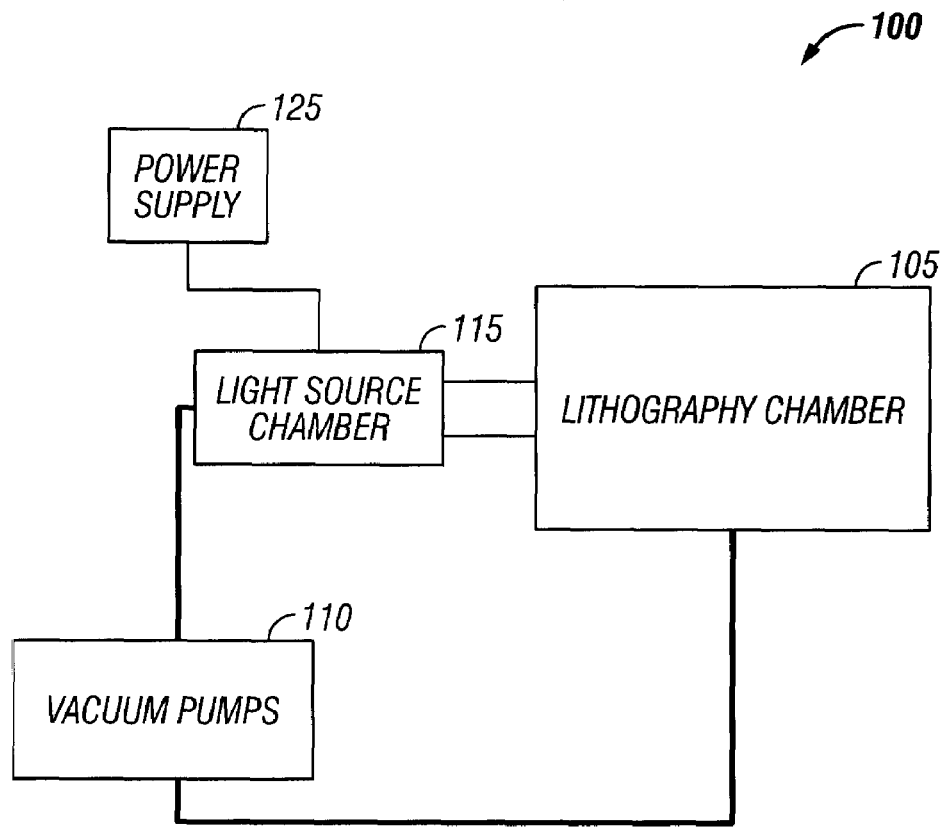
FIG. 1 is a block diagram of a lithography system.

FIG. 1 shows a lithography system 100. A wafer, coated with a light sensitive coating ("photoresist"), and a mask may be placed in a lithography chamber 105. The pressure in the lithography chamber 105 may be reduced to a near vacuum environment by vacuum pumps 110. A light source chamber 115, which houses a light source, is connected to the lithography chamber 105. The pressure in the light source chamber may also be reduced to a near vacuum environment by the vacuum pumps 110. The light source chamber and lithography chamber may be separated by a valve 120 which may be used to isolate the chambers. This allows for different environments within the different chambers.

The light source chamber 115 may be an EUV chamber, which houses an EUV light source. A power supply 125 is connected to the EUV chamber to supply energy for creating an EUV photon emitting plasma, which provides EUV light for lithography. The EUV light may have a wavelength in a range of 11 nm to 15 nm, e.g., 13.5 nm. The source may be a plasma light source, e.g., a laser plasma source or a pinch plasma source. Plasma-producing components, such as electrodes, in the EUV source may excite a gas, such as Xenon, to produce EUV radiation. The EUV chamber may be evacuated by the vacuum pumps 110.

Figure 2:
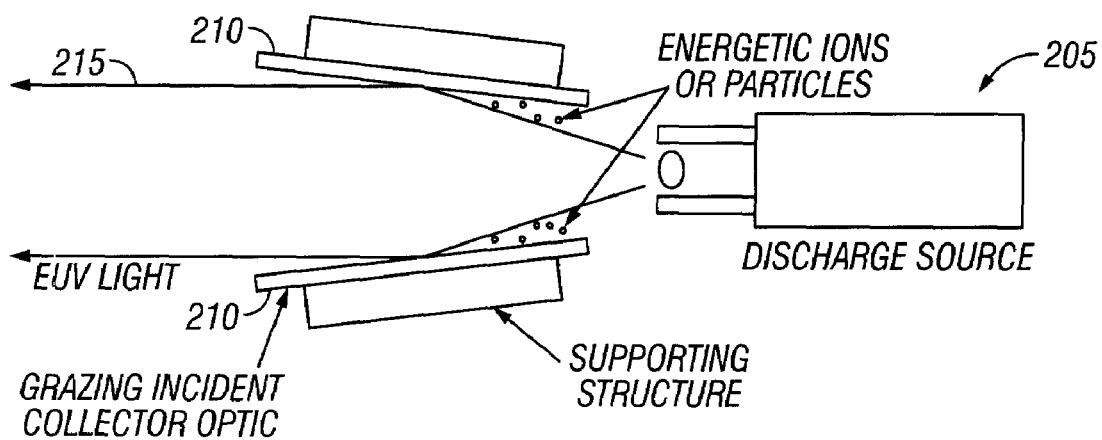
FIG. 2 is a sectional view of a light source chamber.

FIG. 2 shows a sectional view of an exemplary EUV chamber. The light source, in this case a discharge produced plasma (DPP) source 205, and collector mirrors 210 for collecting and directing the EUV light 215 for use in the lithography chamber 105 are inside the EUV chamber. The collector mirrors 210 may have a nominally conical/cylindrical structure.

Tungsten (W) or other refractory metals or alloys that are resistant to plasma erosion may be used for components in the EUV source. However, plasma-erosion may still occur, and the debris produced by the erosion may be deposited on the collector mirrors 210. Debris may be produced from other sources, e.g., the walls of the chamber. Debris particles may coat the collector mirrors, resulting in a loss of reflectivity. Fast atoms produced by the electric discharge (e.g., Xe, Li, Sn, or In) may sputter away part of the collector mirror surfaces, further reducing reflectivity.

In an embodiment, a magnetic field is created around the collector mirrors to deflect charged particles and/or highly energetic ions 220 and thereby reduce erosion. A magnetic field may be generated using a solenoid structure. This magnetic field may be used to generate Lorentz force when there is a charged particle traveling perpendicular or at certain other angles with respect to the magnetic field direction. By applying high current (I) and many loops around the ferromagnetic tube, a high magnetic field can be generated.

Figure 3:
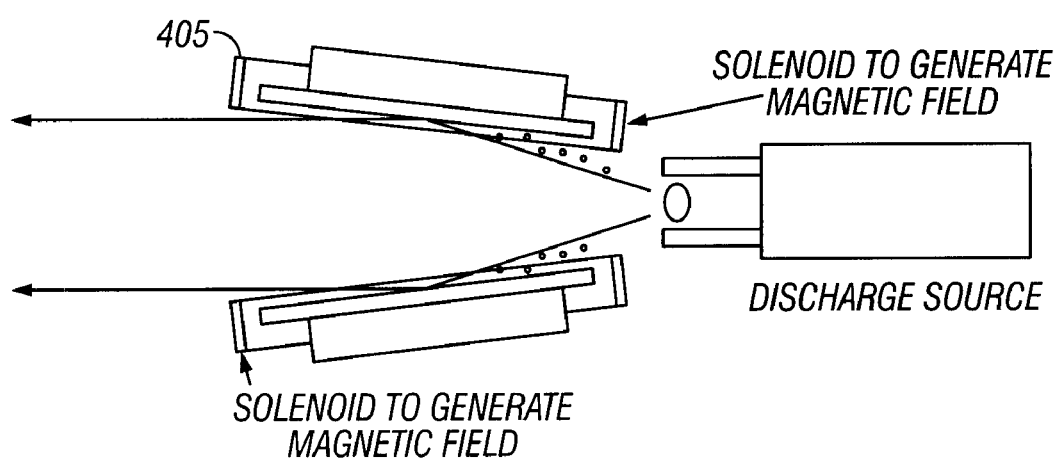
FIG. 3 is a sectional view of a light source chamber including a magnetic field generator in a Discharge Produced Plasma (DPP) system.
Figure 4A:
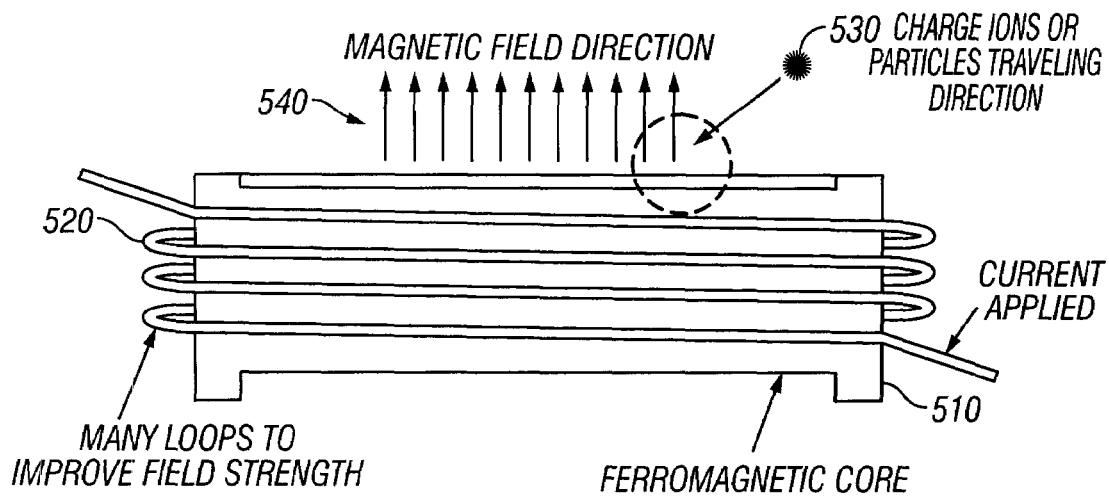
FIG. 4A is a side view of a magnetic field generator for collector optics.
Figure 4B:
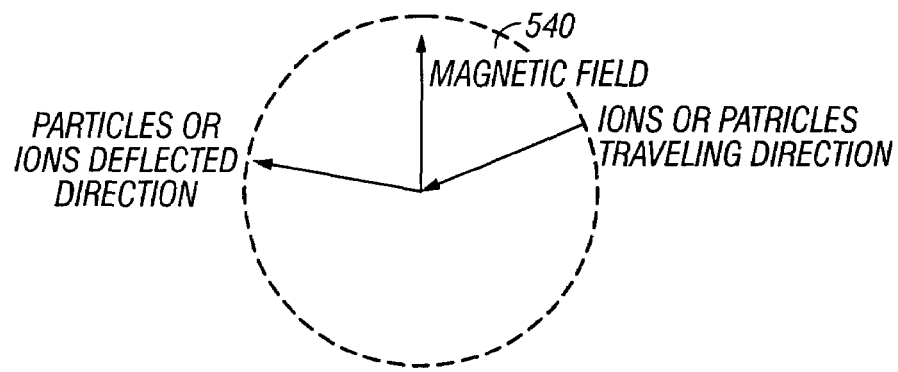
FIG. 4B illustrates the effect of a magnetic field on debris particles.
Figure 5:
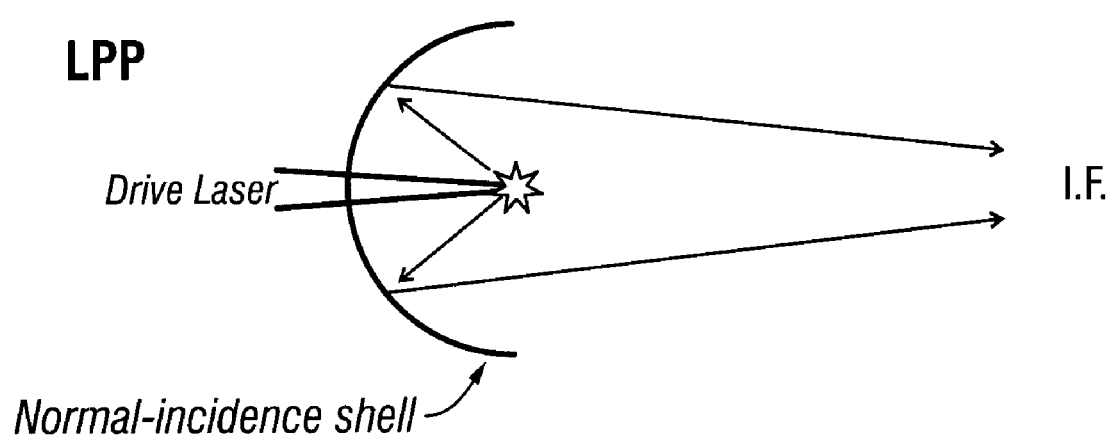
FIG. 5 is a sectional view of a light source chamber including a magnetic field generator in a Laser Produced Plasma (LPP) system.

FIG. 3 shows an exemplary arrangement including a magnetic field generator 405 added in the collector optics. FIG. 4A is enlarged view of a single collector element with the magnetic field generator. The magnetic field generator includes a ferromagnetic core 510 and a coil 520 with many loops to improve the field strength. High velocity particles or ions 530 may be deflected away from the surface of the collector optics by the magnetic field 540 as shown in FIG. 4B, thereby reducing any sputtering or erosion of the surface material. A cooling system may be included around to the solenoid structure for thermal management.

In an alternative embodiment, a magnetic field generator 570 may be implemented in a laser produced plasma (LPP) system.

Figure 6A:
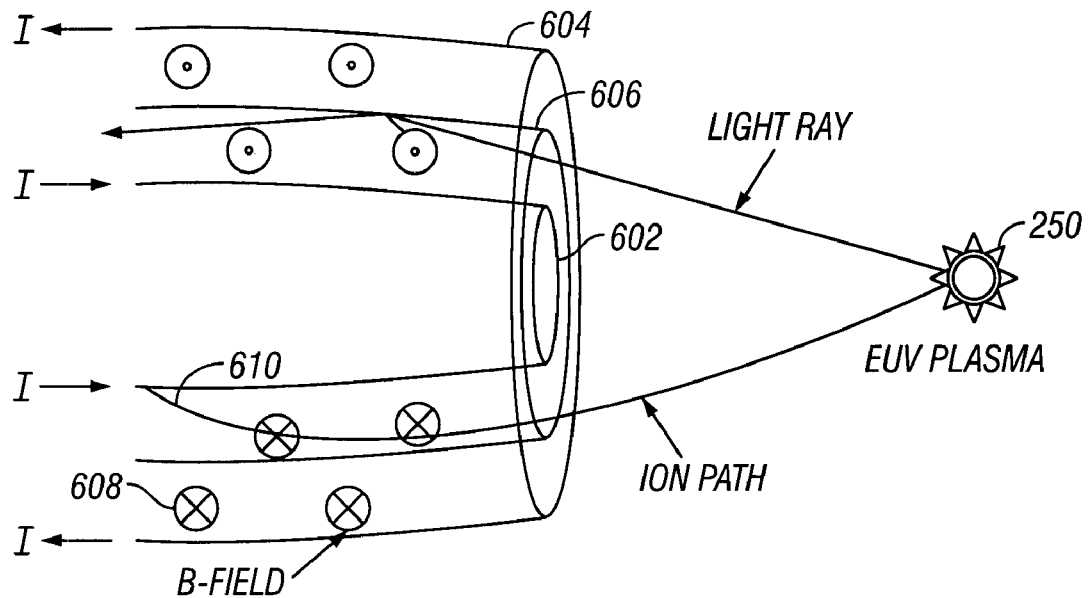
FIG. 6A is a perspective view of nested collector optics and illustrates the effect of a generate magnetic field on a debris particle.
Figure 6B:
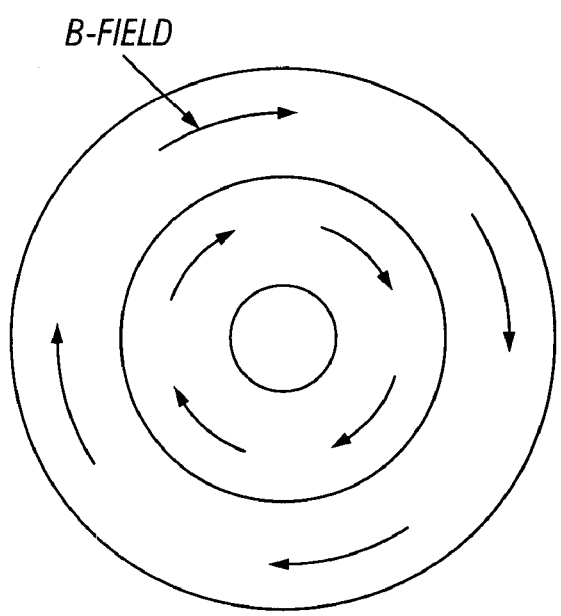
FIG. 6B is an end view of the nested collector optics and magnetic field of FIG. 6A.

The collector optics may have a nested shell arrangement, as shown in FIGS. 6A and 6B. The collector optics may include an inner shell 602, and outer shell 604, with one or more intervening shells 606. Each of the shells may have a reflective inner surface (i.e., facing toward the center of the shell structure) and a non-reflective backside.

An azimuthal magnetic field 608 may be produced by passing a current down the length of the inner and outer shells 602, 604, or alternatively, separate extra-thick shells concentric with the actual reflective shells. Such a field would then act to carry a positively charged ion 610 towards the non-reflective backside of each collector shell.

In an exemplary system, inner and outer current-carrying shells (coaxial with the reflective shells) of 1 cm thick copper are provided. In an embodiment, the outer shell has a radius of 10 cm and a cross-sectional area (2 pi r dr) of approximately 6000 cm$^2$, and a length of 20 cm. The amount of current such a shell can tolerate is given by:

$R=?L/A=2\cdot 10^{-8}*0.2$ m$/6\cdot 10^{-3}$ m$^2 \sim 6.6\cdot 10^{-3}$?.

Current: $I=sqrt(P/R)=$sqrt(1 kW$/6.6\cdot 10^{-3}$ ?)=39 kA.

This assumes that the shell can tolerate a heat load of 1 kW over the shell. This is only a small fraction of heat delivered by a high volume manufacturing (HVM) source (100 s of kW) and corresponds to a heat loading of only 1 kW/(2 pi*10 cm*20 cm)~1 W/cm$^2$.

Using Ampere's law, the strength of the magnetic field produced using this current is given by:

$B \sim ?_0 I/4?r = 1.26\cdot 10^{-6}$??m$*3.9\cdot 10^4$ $A/(4?*0.1$ m$)=$ 0.04 $T$ Assuming a radius of 1 m is required to match the curvature of the shell, the magnetic field could deflect a single-charge Xe ion with a speed given by:

$R=mV/qB \rightarrow V=qBR/m=1.6\cdot 10^{-19}$ C$*0.04$ $T*1$ m$/2\cdot 10^{-25}$ kg$=3.2\cdot 10^4$ m/s In eV: $KE=0.5*2\cdot 10^{-25}$ kg$*(3.2\cdot 10^4$ m/s$)^2*6.3\cdot 10^{18}$ eV/J=640 eV Such energies may cover the vast majority of ions discharged from typical EUV sources. The small minority with energies of several keV might be slowed to 500 eV or less by the time they reach the collector section by introducing a buffer gas.

Figure 7A:
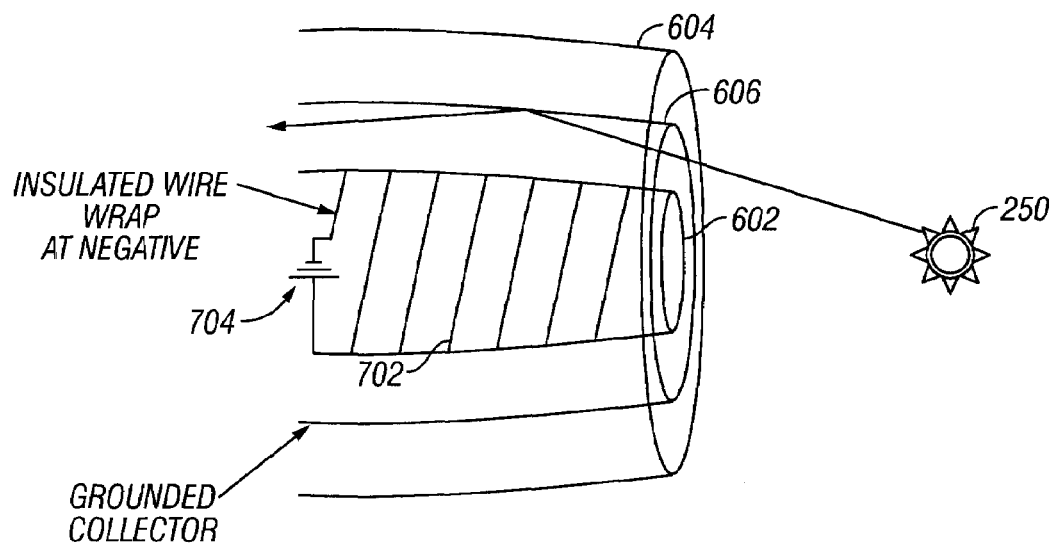
FIG. 7A is a perspective view of nested collector optics with a magnetic field generator according to another embodiment.
Figure 7B:
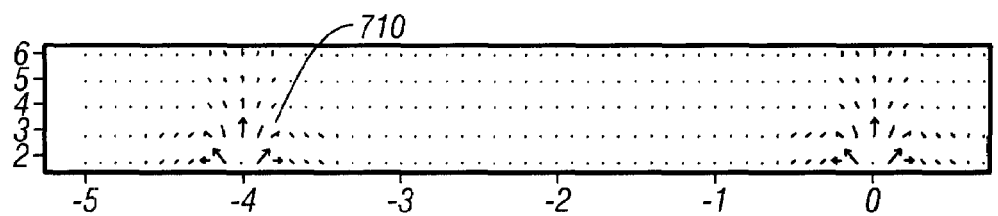
FIG. 7B illustrates a dipole field generated by a wire in the nested collector optics of FIG. 7B.

In an embodiment, a series of insulated wires 702 are wrapped around the outside of each shell, thus avoiding any blockage of the light, as shown in FIG. 7A. The wires 702 may be charged to a potential while the shells are held to a ground 704. Near one of the wires, the presence of the grounded plane results in a dipole field 710, as shown in FIG. 7B. The strong gradients present in the dipole field may serve to collect even neutrally charged particles.

For an embodiment with a wire wrap pitch of 2 mm and wire size of 200 micron held at 200V, a rough estimate of capture time for a 100 nm SiO$_2$ particle (density 2300 kg/m$^3$ ($m_p=1.2\cdot 10^{-18}$ kg)) with a charge of 5 eV is 0.1 ms, and 0.1 s for the same particle with no charge.

Figure 8:
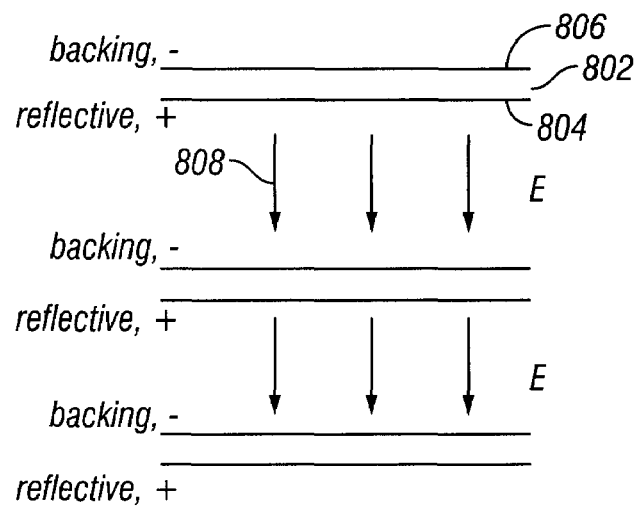
FIG. 8 is a sectional view of nested collector optics with a magnetic field generator according to another embodiment.

The embodiments described above utilize magnetic fields to mitigate debris. In alternative embodiments, electric fields may be used to mitigate debris. For example, in an embodiment, each collector shell may be split into two conducting layers, which are separated by an insulator 802, as shown in FIG. 8. The reflective layer 804 is charged to a positive state and the non-reflective side 806 to a negative state. This creates an electric field 808 pointing away from each reflective surface 804, and towards the backing of the neighboring shell. This approach may work particularly well for positively charged ions, carrying them away from the reflective surfaces and towards the non-reflective surfaces. Positively charged ions are known to be one of the primary sources of damage of the collectors. However, this may not work as well for neutrals as the field gradient would be relatively weak.

For an embodiment with 10 cm long plates separated by 1 cm and a potential difference of 100V, rough estimates suggest singly charged (1 eV) Xe atoms with energy up to 2.5 keV could be captured.

In other embodiments, the wire and split-plate approaches described above in connection with FIGS. 7A and 8, respectively, may be combined in various ways. For example, a split-plate approach may be used for a section of the collector nearest the light source and wires may be applied to a section farthest from the light source. Alternatively, wires or bumps may be placed on the non-reflective collector side to introduce larger field gradients and thus increase the capture rate neutrals. In another embodiment, electret fibers may be used instead of wires connected to a power supply. Electret fibers are permanently imbued with an electric dipole moment. Electret fibers are commercially available, and are produced by the mature process of polymer melt-blowing with either corona charging or electrostatic fiber spinning. In the latter technique, the fibers are continuously released in liquid state out of a die into a region of a strong electric field. After some distance the fiber crystallizes with the electric field embedded in it. Fiber thickness can reach below 1 micron, although 100 microns is used in the present description for mechanical reliability. In another embodiment, the backside surface of each collector may be grooved or textured to assist collecting any particles that are drawn to the surface. In yet another embodiment, either charged wires or electret fibers could be attached perpendicularly between the shells, forming a web that would attract particles. A disadvantage to this approach is that some light would be absorbed and fast particles may make it through the web. However, negatively charged particles would be attracted to the reflective surface, making this approach favorable if such particles were in the minority.

Figure 9:
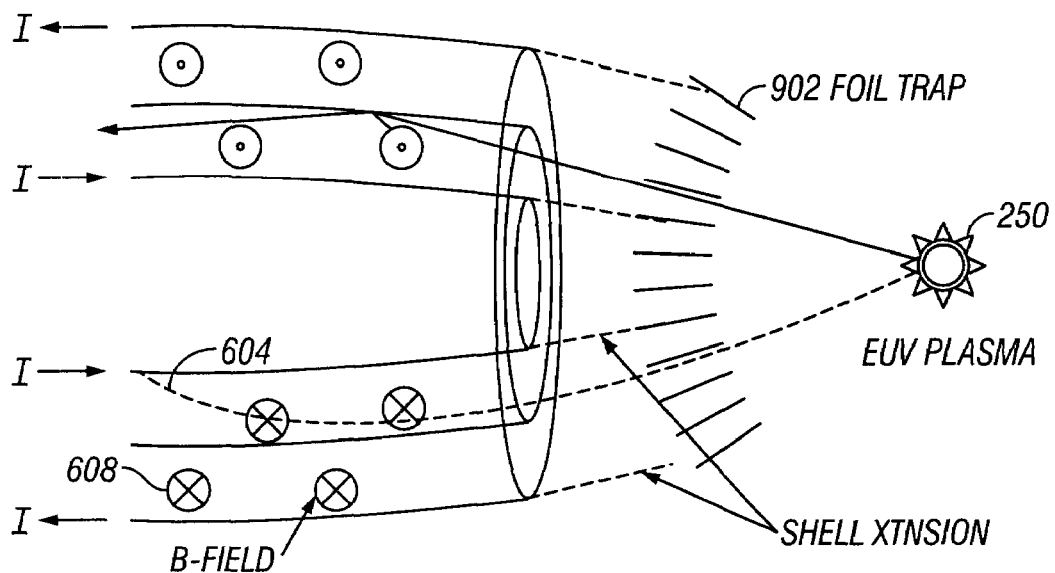
FIG. 9 is a perspective view of a light source chamber including collector optics and a foil trap to trap debris.

In an embodiment, debris-contaminant "foil traps", e.g., foil elements 902, may be positioned between the source 205 and the collector mirrors 210, as shown in FIG. 9. The foil elements may be small, thin foils spaced apart from each other by, e.g., 1 mm and spaced apart from the source by, e.g., 10-20 mm. Typically, the debris particles travel in a jagged path characteristic of Brownian motion. This path makes the debris particles susceptible to striking, and being captured by, the foil traps.

The outer and inner current-carrying shells may extend towards the foil trap and thus extend the magnetic field into the trap. The thinly spaced foils may capture ions only slightly deflected, giving the magnetic field more time to act on an ion.

In the embodiments above, the magnetic field may be enhanced by incorporating ferrous materials into the various components.

A number of embodiments have been described. Nevertheless, it will be understood that various modifications may be made without departing from the spirit and scope of the invention. Accordingly, other embodiments are within the scope of the following claims.

The invention claimed is:

1. An apparatus comprising:
   a plasma produced electromagnetic radiation source;
   one or more collector optics; and
   a magnetic field generator operative to generate a magnetic field around the one or more collector optics, the magnetic field generator comprising windings around a non-reflective surface in the one or more collector optics.

2. The apparatus of claim 1, wherein the windings comprise at least one of a wire, a bump, and an electret fiber.

3. The apparatus of claim 1, further comprising a potential difference between the windings and the non-reflective surface.

4. The apparatus of claim 1, wherein the collector optics comprise a plurality of nested shells, the shells including reflective surfaces and non-reflective surfaces.

5. The apparatus of claim 4, wherein the magnetic field generator comprises a current supply connected to one or more of the nested shells and operative to provide a current along a length of said one or more nested shells.

6. The apparatus of claim 4, wherein the magnetic field generator comprises a voltage supply connected between a reflective side and a non-reflective side of one or more of said nested shells.

7. The apparatus of claim 4, wherein the magnetic field generator comprises:
   a first additional shell around the collector optics;
   a second additional shell inside the nested shells in the collector optics; and
   a voltage supply operative to provide a potential difference between the first additional shell and the second additional shell.

8. The apparatus of claim 1, further comprising:
   a plurality of foil traps between the source and the collector optics.

9. The apparatus of claim 1, wherein the electromagnetic radiation source comprises an extreme-ultraviolet (EUV) electromagnetic radiation source.

10. An apparatus comprising:
    a plasma produced electromagnetic radiation source;
    one or more collector optics; and
    a magnetic field generator operative to generate a magnetic field around the one or more collector optics, the magnetic field generator comprising a solenoid structure wrapped around a reflective surface in the one or more collector optics.

11. The apparatus of claim 10, wherein the electromagnetic radiation source comprises an extreme-ultraviolet (EUV) electromagnetic radiation source.

12. The apparatus of claim 10, further comprising: a plurality of foil traps between the source and the collector optics.

13. A method comprising:
    generating a magnetic field around collector optics in a lithography system with windings around a non-reflective surface in the collector optics; and
    deflecting debris particles generated by a plasma producing electromagnetic radiation source from a reflective surface in the collector optics.

14. The method of claim 13, wherein deflecting the debris particles comprises deflecting the debris particles toward a non-reflective surface in the collector optics.

15. The method of claim 13, wherein the windings comprise at least one of a wire, a bump, and an electret fiber.

16. The method of claim 13, further comprising introducing a potential difference between the windings and the non-reflective surface.

17. The method of claim 13, wherein the collector optics comprise a plurality of nested shells, the shells including a reflective surface and a non-reflective surface.

18. The method of claim 17, wherein deflecting the debris particles comprises deflecting the debris particles from a reflective side of one shell to the non-reflective surface of an adjacent shell.

19. The method of claim 17, wherein generating the magnetic field comprises providing a current along a length of each of said nested shells.

20. The method of claim 17, wherein generating the magnetic field comprises introducing a potential difference between the reflective side and the non-reflective side of each nested shell.

21. The method of claim 17, wherein generating the magnetic field comprises introducing a potential difference between a first additional shell around the collector optics and a second additional shell inside the nested shells in the collector optics.

22. The method of claim 13, further comprising: capturing debris particles with foil traps between the source and the collector optics.

23. The method of claim 13, wherein the lithography system comprises an Extreme Ultraviolet (EUV) lithography system.

24. A method comprising:
    generating a magnetic field around collector optics in a lithography system with a solenoid structure wrapped around a reflective surface in the collector optics; and
    deflecting debris particles generated by a plasma producing electromagnetic radiation source from the reflective surface in the collector optics.

25. The method of claim 24, further comprising capturing debris particles with foil traps between the source and the collector optics.

26. The method of claim 24, wherein the lithography system comprises an Extreme Ultraviolet (EUV) lithography system.

27. The apparatus of claim 1, wherein the magnetic field generator comprising windings wrapped around an outside of the one or more collector optics.

28. The apparatus of claim 10, wherein the magnetic field generator is configured to generate a magnetic field having a magnitude and a direction effective to deflect a majority the charged species generated by the source of electromagnetic radiation.

29. The apparatus of claim 28, wherein the magnetic field generator is configured to generate a magnetic field having a magnitude and a direction effective to deflect a single charge Xe ion having an energy of 640 eV.

* * * * *